US012513852B2

(12) United States Patent
Kelly et al.

(10) Patent No.: US 12,513,852 B2
(45) Date of Patent: Dec. 30, 2025

(54) MOBILE DATA CENTER PLATFORM WITH IMMERSION COOLING

(71) Applicant: Rykor Energy Solutions, LLC, Raynham, MA (US)

(72) Inventors: John C. Kelly, Milton, MA (US); Charles E. Wilson, Livingston, TX (US); Edward John Porreca, Jr., Attleboro, MA (US)

(73) Assignee: Rykor Energy Solutions, LLC, Raynham, MA (US)

( * ) Notice: Subject to any disclaimer, the term of this patent is extended or adjusted under 35 U.S.C. 154(b) by 149 days.

(21) Appl. No.: 18/204,371

(22) Filed: May 31, 2023

(65) Prior Publication Data

US 2023/0389225 A1 Nov. 30, 2023

Related U.S. Application Data

(60) Provisional application No. 63/347,218, filed on May 31, 2022.

(51) Int. Cl.
*H05K 7/20* (2006.01)
*H05K 7/14* (2006.01)

(52) U.S. Cl.
CPC ....... *H05K 7/20236* (2013.01); *H05K 7/1497* (2013.01)

(58) Field of Classification Search
CPC ... H05K 7/1497; H05K 7/20236; H05K 7/203
See application file for complete search history.

(56) References Cited

U.S. PATENT DOCUMENTS

| | | | | |
|---|---|---|---|---|
| 9,504,190 | B2* | 11/2016 | Best | H05K 7/2079 |
| 9,756,766 | B2* | 9/2017 | Best | H05K 7/20718 |
| 10,405,457 | B2* | 9/2019 | Boyd | H05K 7/20272 |
| 12,089,368 | B2* | 9/2024 | Bean, Jr. | H05K 7/20272 |
| 2014/0301037 | A1* | 10/2014 | Best | H05K 7/20781 29/857 |
| 2014/0307384 | A1* | 10/2014 | Best | H05K 7/1497 361/679.53 |
| 2021/0378148 | A1* | 12/2021 | Chen | H05K 7/20272 |
| 2022/0104393 | A1* | 3/2022 | Boyd | H05K 7/20781 |
| 2022/0104394 | A1* | 3/2022 | Boyd | H05K 7/20272 |
| 2023/0380102 | A1* | 11/2023 | Ahuja | H05K 7/20272 |
| 2023/0389237 | A1* | 11/2023 | L'Ecuyer | H05K 7/20272 |
| 2024/0074095 | A1* | 2/2024 | Pan | H05K 7/20272 |

* cited by examiner

*Primary Examiner* — Robert J Hoffberg
(74) *Attorney, Agent, or Firm* — Brown Rudnick LLP; Matthew P. York

(57) ABSTRACT

The invention provides a mobile data center for housing and managing a plurality of computing devices within and further optimizing the efficiency of the computing devices operation by providing liquid immersion cooling thereto.

16 Claims, 8 Drawing Sheets

Mobile Data Center

Interior of shipping container (prior to conversion)

Modular tank (fabrication)

Modular tank (installed)

MOBILE DATA CENTER PLATFORM WITH IMMERSION COOLING

CROSS-REFERENCE TO RELATED APPLICATIONS

This application claims priority to, and the benefit of, U.S. Provisional Application No. 63/347,218, filed on May 31, 2022, the content of which is incorporated by reference herein in its entirety.

TECHNICAL FIELD

The disclosure relates generally to heat dissipation systems, and, more particularly, to a mobile data center platform employing liquid submersion cooling of electronic hardware devices within.

BACKGROUND

Computing devices perform increasingly varied and intensive tasks every day in the service of all areas of human industry. Some of the most energy-intensive tasks are blockchain transactions, which use encrypted history of the subject of the transaction in blocks. Blockchain is useful because it can provide security of the subject of the transaction, such as in cryptocurrency transactions. One such transaction is the generation of new cryptocurrency, also known as mining.

Computers require massive amounts of energy when performing intensive tasks such as cryptocurrency mining. Because each step of the process requires validation, and there are thousands of steps being calculated each second, the computing devices draw a large amount of electricity. The devices themselves also generate a large amount of heat in processing such transactions. Accordingly, one of the most important criteria for efficient mining operation is the effective control of internal facilities temperatures. For example, operations generally realize an increase of 2.5% power consumption when high temperatures are present in the operations environment. As such, higher temperatures significantly reduce the power consumed, so managing the heat dissipation of the miners (computers) is critically important.

Current techniques for managing heat generated by a processing unit of a computing device generally involve fans. However, air-cooled, fan driven cooling mechanisms are susceptible to overheating and rely on the ambient air temperature to function. For example, with regard to large capacity mining facilities, the most common heat dissipation tool is the use of suction fans to draw out high temperature air and replace it with cooler air. Unfortunately, these suction fans consume large amount of electricity themselves. For example, a 3000 KW conventional mining facility requires forty-eight suction fans. In total, these suction fans consume 50 KW electricity, which is 1.5% of the mining site capacity. Moreover, the single largest expense item associated with any mining facility is the cost of the miners. Reducing miners' repair frequency and miners' failure rate will result in increased return of investment.

SUMMARY

The invention of the present disclosure relates generally to a mobile data center for housing and managing a plurality of computing devices primarily used for energy-intensive computing tasks. In particular, the present invention is directed to a mobile data center, generally in the form of a shipping container or the like, that is resilient to the elements (i.e., exterior conditions, including wind, rain, and low/high temperatures) and is designed to house a plurality of computing devices for running data intensive applications, such as cryptocurrency mining, or other energy-intensive computing tasks.

The converted shipping container is outfitted with modular immersion tanks that are placed horizontally along a floor of the container and are configured to house a set of mining units or rigs (i.e., application-specific integrated circuit (ASIC) miners or the like). Each immersion tank contains a fluid providing liquid immersion cooling for each mining unit, or "rig," so as to optimize energy conservation, as the rigs process high throughput electronic transactions like those used in cryptocurrency mining, the processing of non-fungible tokens, or other blockchain technologies. Removable floor panels are fitted over the immersion tanks, thereby providing flooring upon which users (i.e., maintenance technicians and the like) can walk and move about within the confines of the container while still gaining access to any given immersion tank and the mining rigs within. Furthermore, the shipping container is further outfitted with an electrical distribution system, including a busway system for providing electrical power to the mining rights. By utilizing a busway system, along with power distribution units (PDUs), electric power to any given mining rig, or a set of mining rigs, may be shut down without impacting the remaining mining rigs. Accordingly, repairs or adjustments can be made to any given mining rig while electrical power is still being distributed to the remaining mining rigs. As such, the electrical distribution design of the present invention avoids costly downtime that other mining systems suffer from (i.e., other mining systems require that electrical power be shut down to the entire system during maintenance or repairs for a given mining rig, or set of mining rigs).

Advantages of the invention include that the transactional capacity for the immersion cooled rig setup is 27% higher than a comparable air-cooled unit. The power utilization is only 5.7% higher. in total, this means that the invention has significant cost effectiveness advantages over an air-cooled design. Notably, the baseline power for each rig is lower than for an air-cooled design, though the ancillary power to run the container itself is higher. This does result in the slightly higher power utilization overall as compared to a liquid-cooled design. A liquid cooled design can be operated regardless of the ambient temperature, whereas air cooled designs are highly dependent on the ambient temperature outside, and thus efficiency and profitability become dependent on the weather; the invention may be operated at ambient temperatures up to 100-110° F. The invention also provides longer uptime, that is the percentage of time when the system can be operated, than a comparable air-cooled design, which is further susceptible to being negatively impacted upon by dust, pollen, humidity, and other possible environmental factors affecting the air quality.

The invention also has significant advantages over a vertical setup within the shipping container. By laying the immersion tanks and the rigs below the flooring surface of the container, the design of the invention can accommodate more rigs, and to cool them more efficiently compared to a vertical design that is much less efficient. For example, in one embodiment, each immersion tank accommodates 96 rigs, and each shipping container, once converted, can contains 4 immersion tanks, such that a converted shipping container can accommodate up to 384 rigs. By saving space and adding more rigs, the invention presents a significant capacity and efficiency upgrade compared to other liquid cooled designs. Even when overclocking the rigs by up to 41%, this space-saving and highly efficient liquid cooled design was able to maintain the chips at functional temperatures comparable to, or even less than, at baseline. Total efficiencies built into the invention increase potential earnings of a cryptocurrency mining use of the invention by 49%. The overall cost of the system of the invention can be recovered in just 440 days of use, as compared to 518 days of a comparable air-cooled system.

The invention is also advantageous because of the space that is saved above the flooring. This allows for more working area and easy access to each rig and its control unit. The modular design facilitates easy maintenance and allows individual sections to be removed and serviced while keeping the rest of the container operational. The electrical system and fluid paths can be isolated by section if needed. The invention meets National Electrical Code (NEC) standards and is compliant with Occupational Safety and Health Administration (OSHA) standards. Also, by using a standard size shipping container, the mobility of the unit is improved, and allows for efficient delivery of the systems as well as convenience for the customer should the unit need to be moved.

In one aspect, the invention is directed to a mobile data center for housing and managing a plurality of computing devices. The mobile data center includes a housing structure and an immersion cooling assembly provided within the housing structure. The immersion cooling assembly includes one or more modular tanks positioned in a horizontal orientation relative to a base of the housing structure. Each of the one or more modular tanks is configured to contain a non-conductive fluid to immerse a plurality of computing devices within and cool the plurality of computing devices during operation thereof. The non-conductive fluid may include, for example, a fluorochemical or a hydrocarbon base oil. The housing structure may generally be comprised of a converted standard-sized shipping container.

In some embodiments, each of the plurality of computing devices may be configured to provide energy-intensive computing tasks during operation thereof. For example, in some embodiments, one or more of the plurality of computing devices is configured to perform blockchain computing tasks. In some embodiments, one or more of the plurality of computing devices is configured to perform cryptocurrency mining.

The one or more modular tanks are generally positioned under flooring of the housing structure. For example, the flooring of the housing structure may generally include removable tiles, thereby allowing access to various portions of a given modular tank residing below.

In some embodiments, the mobile data center may further include an oil-filled pad mount transformer.

The mobile data center further includes an electrical distribution system, including a busway system for providing electrical power to the plurality of computing devices. The electrical distribution system may further include power distribution units (PDUs) operably associated with the plurality of computing devices. Accordingly, the busway system in combination with the PDUs allows for removal and/or maintenance of one computing device at a time. For example, in some embodiments, the one or more modular tanks is configured to be accessed and serviced while other components within the mobile data center, or otherwise associated with the mobile data center, are operating and/or functioning as intended.

In some embodiments, at least one of the one or more modular tanks is configured to house at least 96 computing devices within. In particular, the immersion cooling assembly comprises at least four modular tanks arranged horizontally within the data center, each of said modular tanks being configured to house 96 computing devices within such that the mobile data center is configured to house and manage cooling of approximately 384 computing devices.

DETAILED DESCRIPTION

By way of overview, the present invention is directed to heat dissipation systems. More specifically, the present invention is a mobile data center platform employing liquid submersion cooling of electronic hardware devices within. The mobile data center is comprised of a housing structure and a liquid immersion cooling assembly provided within the housing structure. The liquid immersion cooling assembly may be comprised of one or more modular tanks positioned horizontally along the base of the housing structure. Each tank is configured to contain a non-conductive fluid to immerse a plurality of computing devices (also referred to herein as "rigs") within. The liquid cools the rigs as they conduct computing tasks, using electricity and generating heat.

Embodiments of the invention may configure the mobile data center and the rigs therein for energy-intensive computing tasks, such as blockchain computing tasks, e.g., cryptocurrency mining. Such computing tasks are known in the art and are a function of the computing devices housed within the invention.

Embodiments of the invention may provide the housing structure as a converted standard-sized shipping container.

Figure 1:
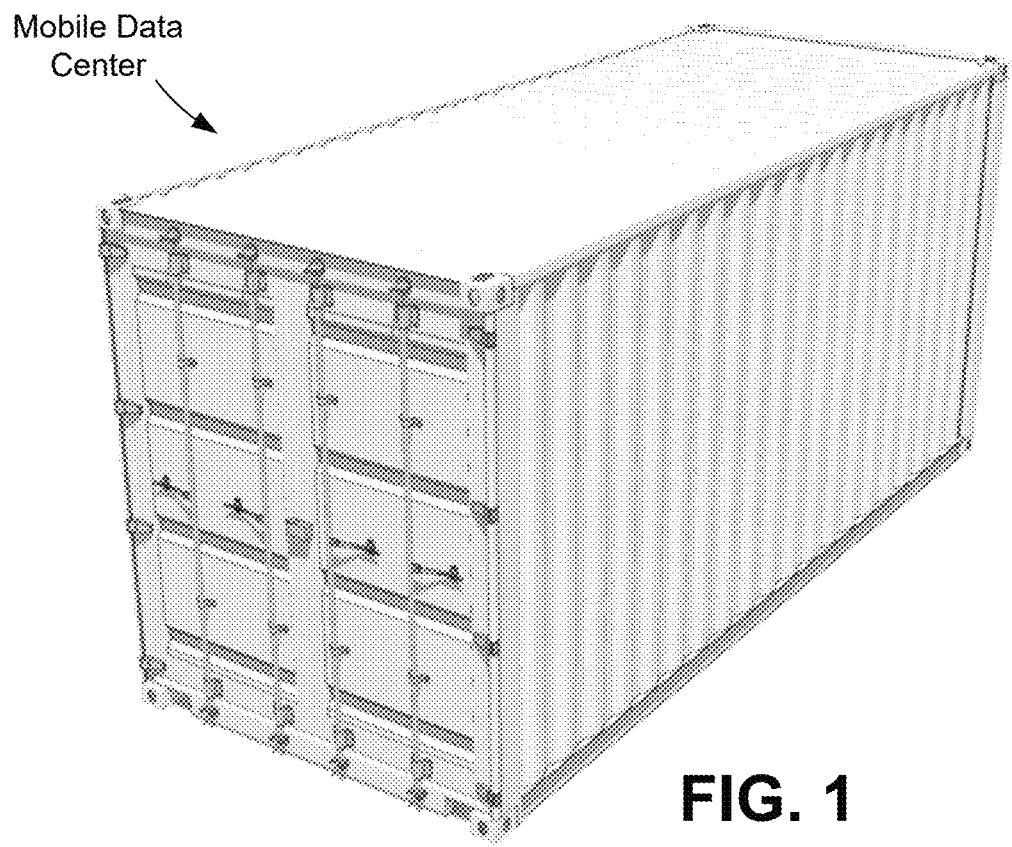
FIG. 1 is perspective view of a standard shipping container configured to serve as the enclosure of the mobile data center of the present invention.
Figure 2:
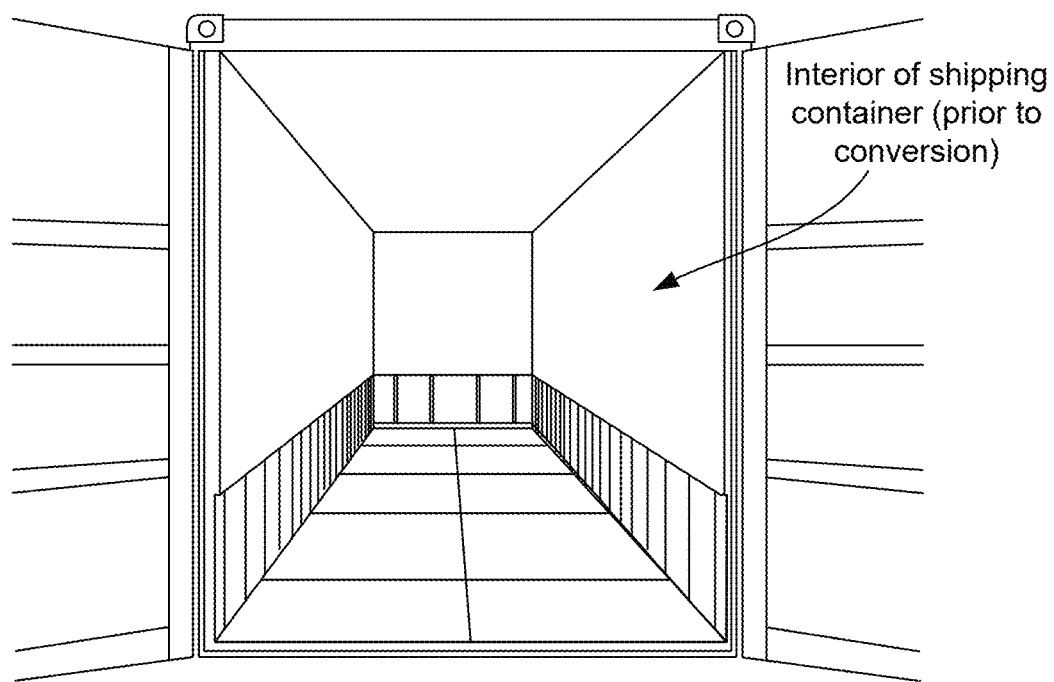
FIG. 2 is an image showing an interior of the shipping container prior to conversion to the mobile data center.

For example, FIG. 1 is perspective view of a standard shipping container configured to serve as the enclosure of the mobile data center of the present invention. The shipping container being a standard size yields several benefits of such an embodiment, enabling easy delivery of the mobile data center, and contributing to the mobility of the data center. FIG. 2 is an image showing an interior of the shipping container prior to conversion to the mobile data center.

Figure 3:
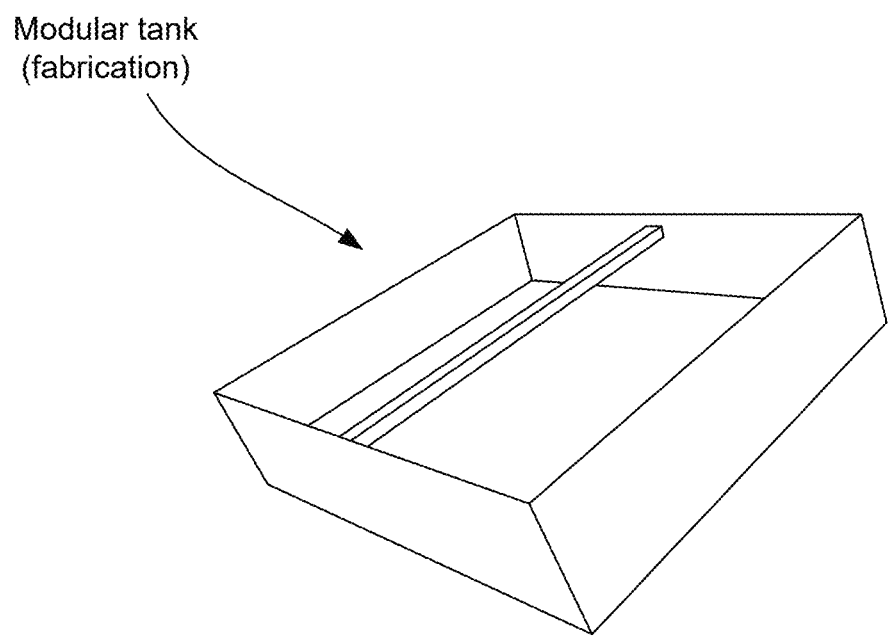
FIG. 3 is an image showing fabrication of an exemplary modular tank of the immersion cooling assembly of the present disclosure.
Figure 4:
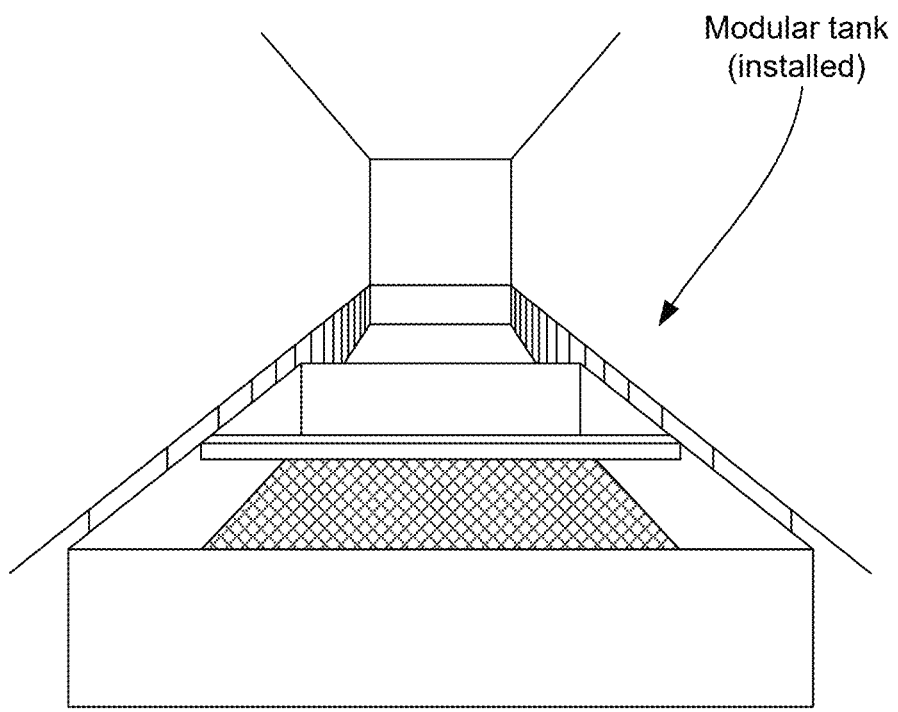
FIG. 4 shows an interior of the shipping container in which one modular tank has been installed.
Figure 5:
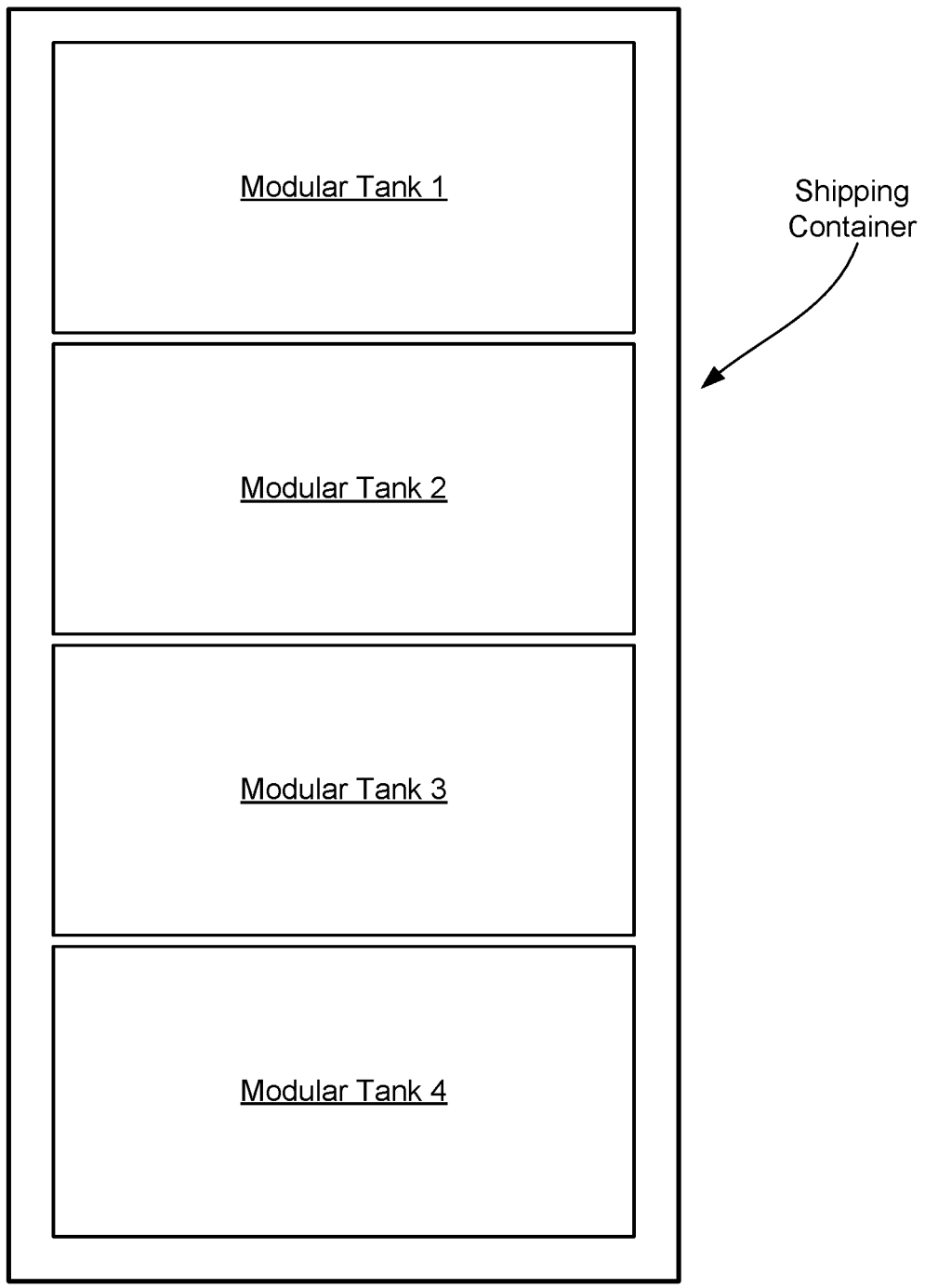
FIG. 5 is a top plan view of an exemplary mobile data center illustrating installation of four modular tanks.

As described in greater detail herein, the converted shipping container is outfitted with modular immersion tanks that are placed horizontally along a floor of the container and are configured to house a set of mining units or rigs (i.e., application-specific integrated circuit (ASIC) miners or the like). FIG. 3 is an image showing fabrication of an exemplary modular tank of the immersion cooling assembly of the present disclosure. FIG. 4 shows an interior of the shipping container in which one modular tank has been installed. FIG. 5 is a top plan view of an exemplary mobile data center illustrating installation of four modular tanks.

As shown, in some embodiments, the immersion cooling assembly may include four liquid immersion cooling tanks arranged horizontally within the data center. However, the invention may be comprised of fewer or more than four assemblies within the data center, such as one assembly, two assemblies, three assemblies, four assemblies, five assemblies, six assemblies, or more than six assemblies. The liquid immersion cooling tanks may be configured to be underneath the flooring of the data center.

Each of the immersion cooling tanks may further include a reservoir of cooling fluid and one or more flow tubes. A first tube may provide fluid to a rig in a given direction, and then a second tube may receive the fluid after contacting the rig and cooling it. The fluid contacting the rig is designed to be a heat sink for the heat generated by the rig during its operation. The tubes then return the fluid to the reservoir, or additional tubing may proceed to an additional step of a cold source distributor that cools the fluid itself, whereupon the fluid would be returned to the reservoir. Embodiments of the invention may utilize a liquid such as a fluorochemical or a hydrocarbon base oil. A fluorochemical is at least partially comprised of fluorine and may be an acidic liquid. Hydrocarbon oils may be mineral oils, synthetic, or natural oils, and ideally have a high boiling point to ensure that the liquid does not change phases in the assembly. The fluid may be chosen for heat transfer performance, material compatibility, flammability, environmental impact, and cost.

A given immersion cooling tank may be configured to hold any number of rigs as desired. For example, in a preferred embodiment, an immersion cooling tank may house 96 rigs, and the mobile data center may include a total of four immersion cooling tanks (thereby allowing for a total of 384 rigs to be housed within). It should be noted that a given modular tank may be sized and/or shaped to hold any desired number of rigs, including, but not limited to, 12 rigs, 16 rigs, 18 rigs, 20 rigs, 24 rigs, 30 rigs, 32 rigs, 36 rigs, 40 rigs, 48 rigs, 54 rigs, 60 rigs, 72 rigs, 80 rigs, 84 rigs, 96 rigs, 100 rigs, 104 rigs, 112 rigs, 120 rigs, or any number of rigs greater or less than any of the example numbers.

With each tank having its given number of rigs, the total amount of rigs within the mobile data center is a product of the numbers of liquid immersion cooling tanks and the rigs in each tank. More rigs allow for more computing power but also comprise more electrical draw and cost of operation.

The mobile data center is also able provide flooring above the liquid immersion cooling tanks and thus a work area for user convenience. It also may provide busways to electrical access points on the walls of the center, enabling each rig to be identified and connected to power at a particular access point.

Figure 6:
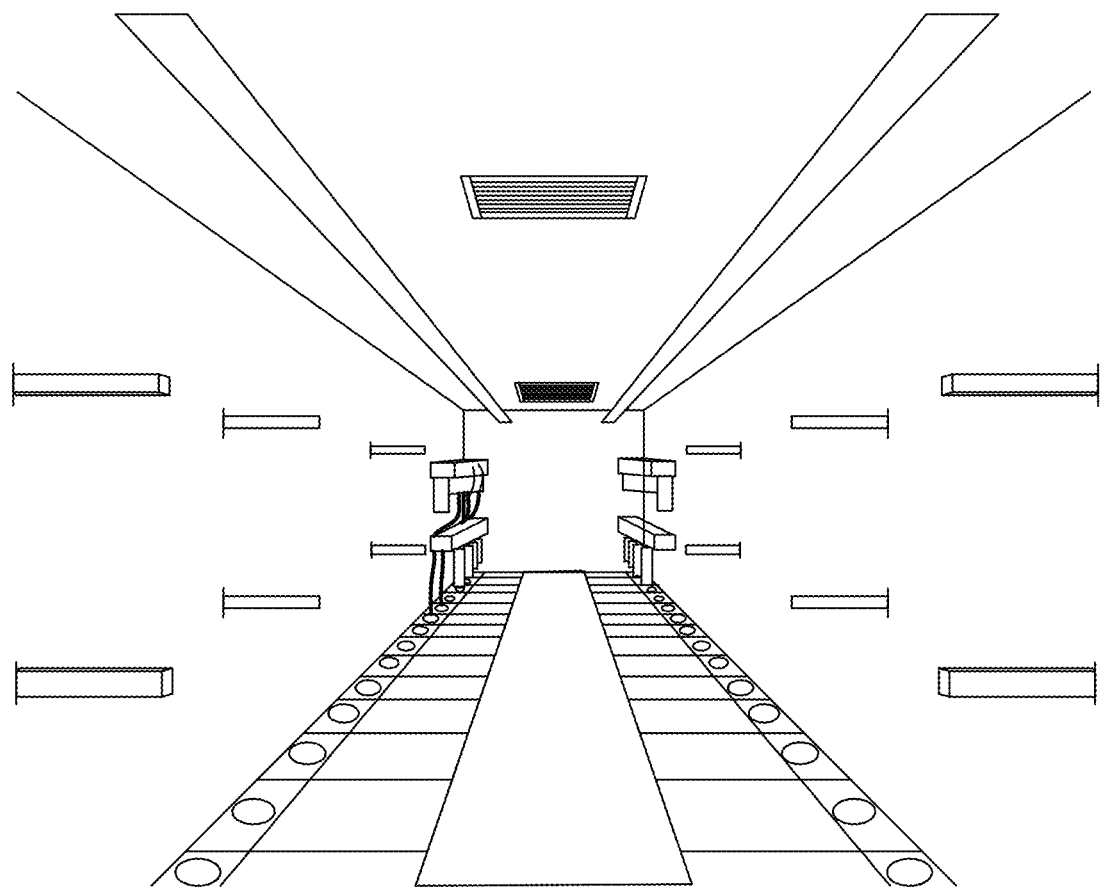
FIG. 6 is an image showing installation of flooring over the modular tanks and further showing support brackets for supporting various components of an electrical distribution system for providing at least electrical power to a plurality of computing devices to be contained within the modular tanks.
Figure 7:
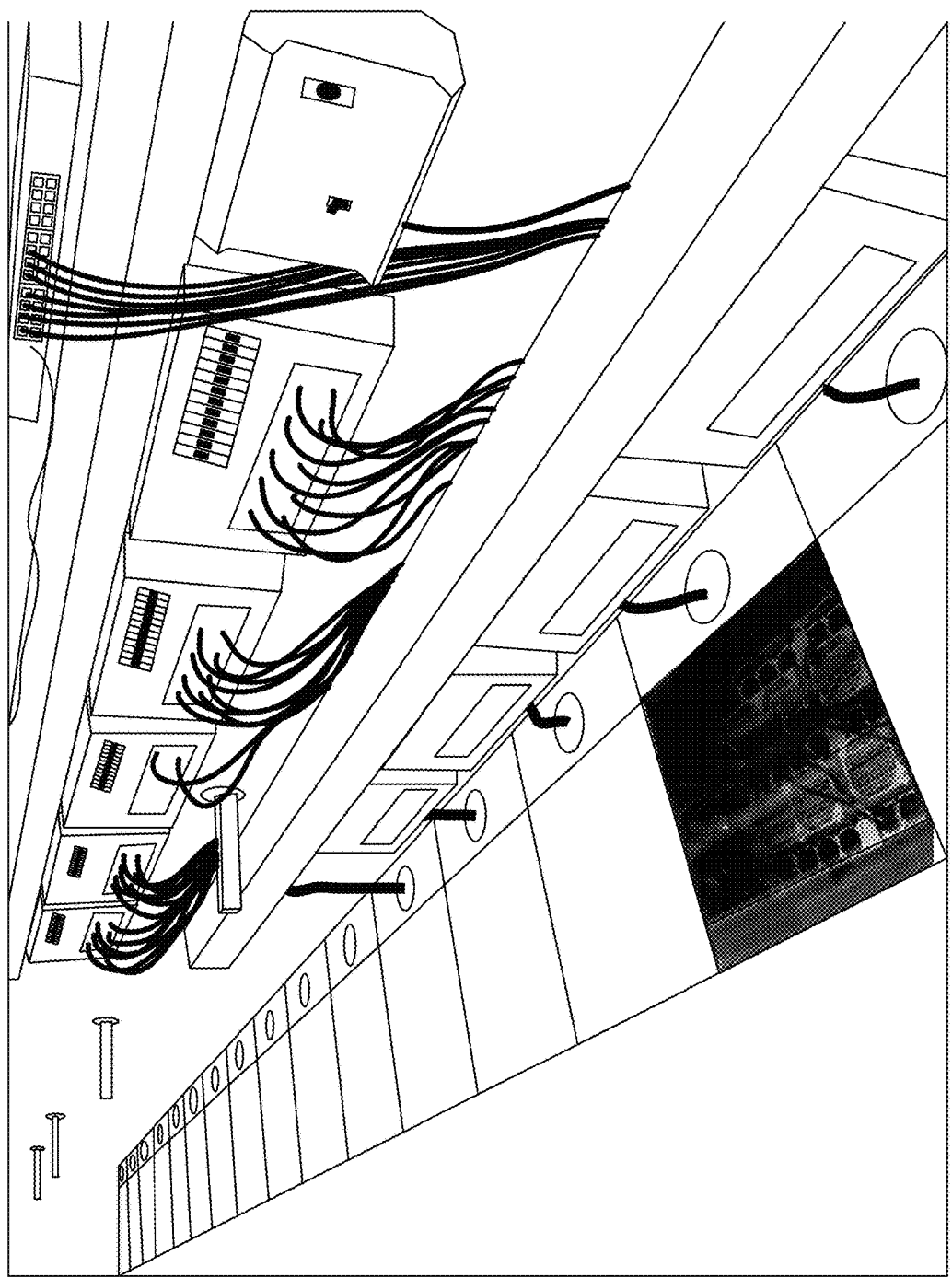
FIG. 7 is an image showing an enlarged view of the electrical distribution system, including a busway system and power distribution units (PDUs) operably coupled to the plurality of computing devices.
Figure 8:
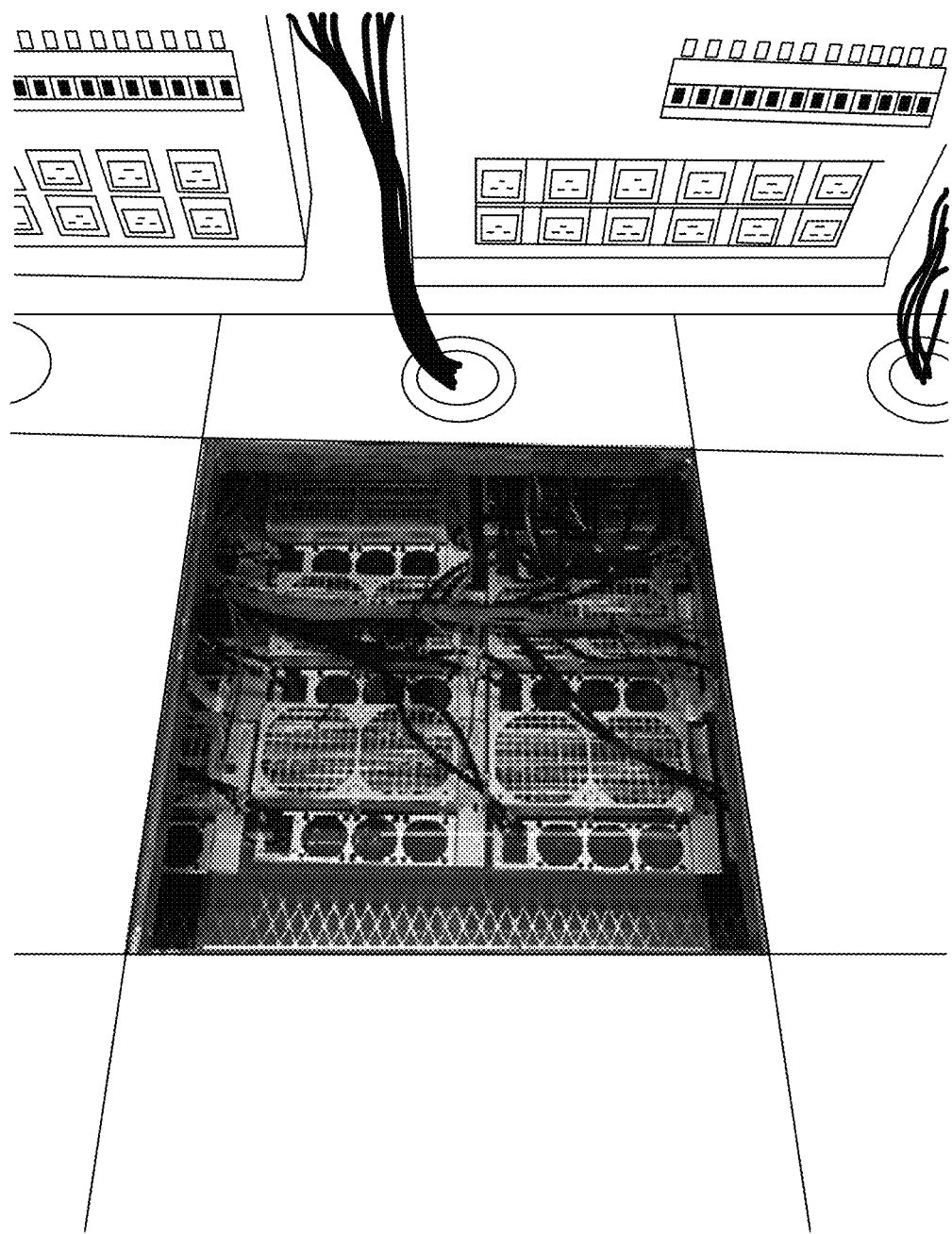
FIG. 8 is an image showing an enlarged view of a flooring tile removed so as to provide access to one or more of the plurality of computing devices within a given modular tank.

For example, FIG. 6 is an image showing installation of flooring over the modular tanks and further showing support brackets for supporting various components of an electrical distribution system for providing at least electrical power to a plurality of computing devices to be contained within the modular tanks. FIG. 7 is an image showing an enlarged view of the electrical distribution system, including a busway system and power distribution units (PDUs) operably coupled to the plurality of computing devices. Removable floor panels are fitted over the immersion tanks, thereby providing flooring upon which users (i.e., maintenance technicians and the like) can walk and move about within the confines of the container while still gaining access to any given immersion tank and the mining rigs within. FIG. 8 is an image showing an enlarged view of a flooring tile removed so as to provide access to one or more of the plurality of computing devices within a given modular tank.

Figure 9:
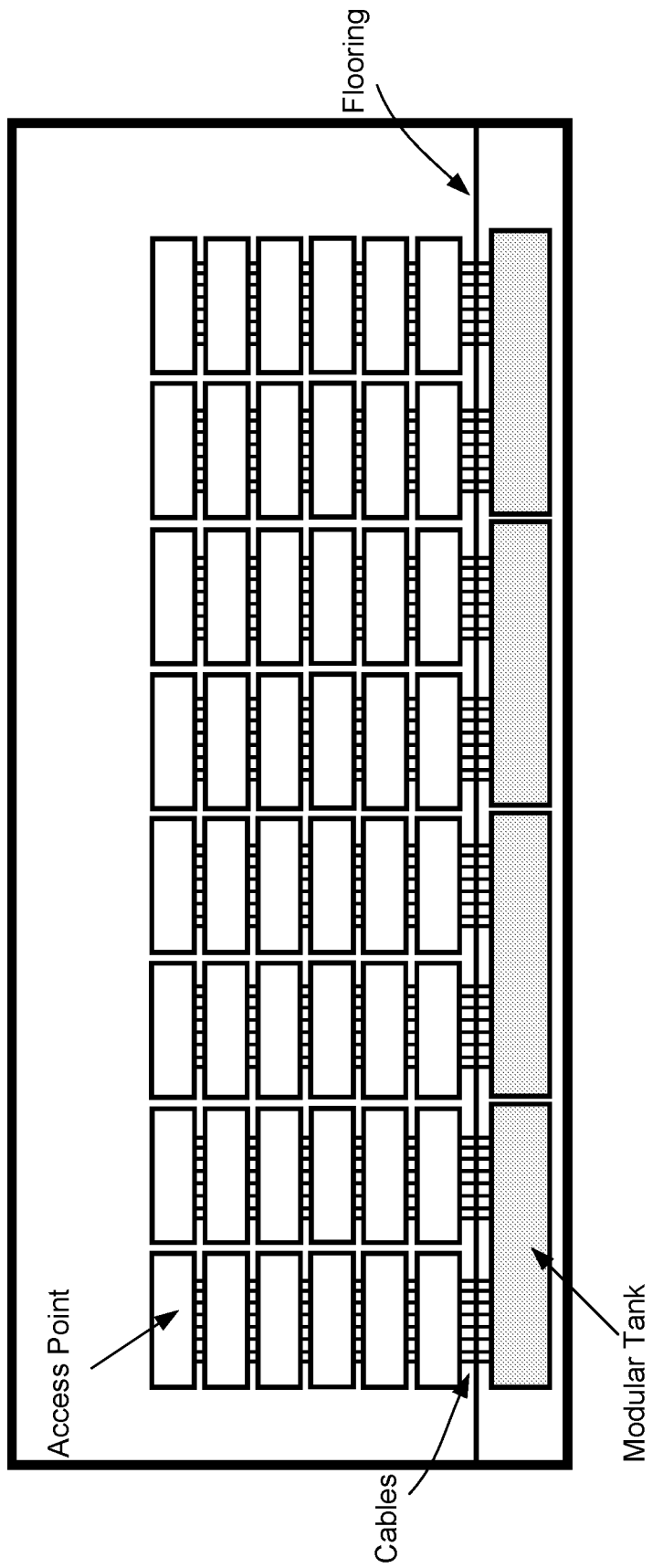
FIG. 9 is a side elevation view of an interior of the mobile data center illustrating the electrical distribution system to be operably coupled to the plurality of computing devices within the modular tanks.
Figure 10:
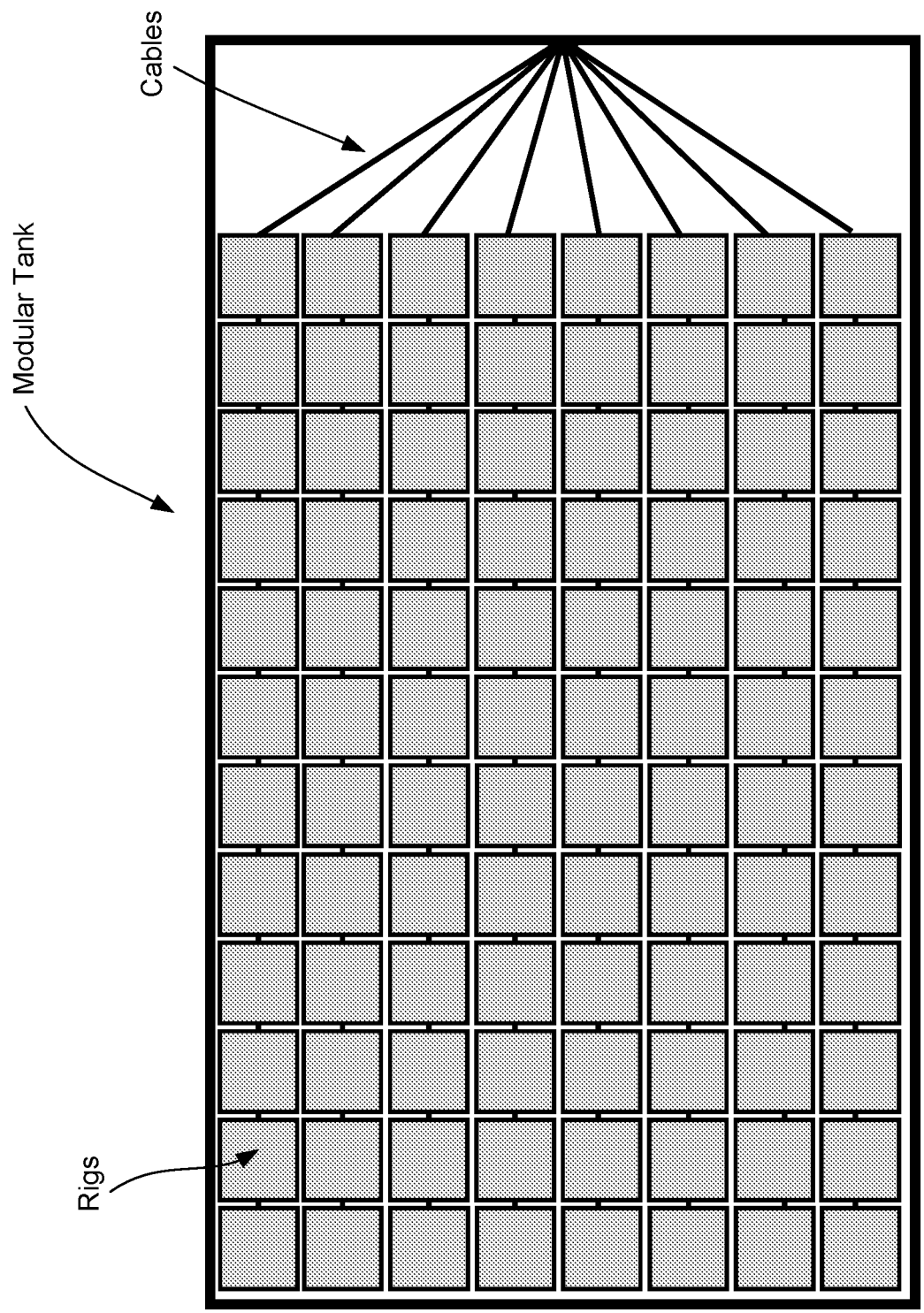
FIG. 10 is a schematic diagram illustrating a liquid immersion cooling assembly of a given modular tank.

FIG. 9 is a side elevation view of an interior of the mobile data center illustrating the electrical distribution system to be operably coupled to the plurality of computing devices within the modular tanks. FIG. 10 is a schematic diagram illustrating a liquid immersion cooling assembly of a given modular tank. As shown, located under the flooring of the mobile data center are the liquid immersion cooling tanks. Also displayed are the cables connecting each rig to the power access points. The busway system may allow for easy identification of a rig needing service or replacement and access to its power. Also displayed are cables connecting each rig to the busway system. In this example embodiment, the assembly comprises 96 rigs total.

The modular design of the liquid immersion cooling assembly within the mobile data center allows one of them to be serviced while keeping the remaining assemblies operational, allowing for continued operation of the data center even during a partial outage.

Embodiments of the invention may include an electrical distribution system, including a busway system for providing electrical power to the rigs. A busway is a prefabricated electrical distribution system consisting of bus bars in a protective enclosure, including straight lengths, fittings, devices and accessories. A busway transports electricity and connects to electrical gear such as switchgear, panelboards and transformers. A busway is an alternative to cable and conduit in commercial and industrial applications. The busway system may allow for removal and maintenance of one rig at a time.

Embodiments of the invention may operate with similar efficiency at ambient temperatures at room temperatures up to 100-110° F. The specific heat of the liquid of the liquid cooling assembly allows for heat to be drawn from the rigs even at higher ambient temperatures. The specific heat of the liquid also enables operation of the mobile data center with a higher percentage uptime than a comparable air-cooled design, because if the rigs overheat, and air-cooled design does not provide as great a heat sink as compared to the liquid immersion cooling assembly. This means that the excess heat of the rig will take longer to dissipate and transfer that energy to the air.

Because of the efficiencies in design and liquid cooling, the mobile data center may have a transactional capacity at least 20% greater than that of an air-cooled system. The rigs may be able to be overclocked by around 40% and still maintain chip temperature.

As compared to an air-cooled design, the mobile data center may use about 5% more power. This is due to the increased operational cost of circulating the fluid and cooling it as compared to using fans and taking advantage of ambient air. However, the efficiencies of the invention and its ability to be used at higher ambient temperatures and irrespective of other air conditions such as humidity and dust allow greater utilization and thus profitability of running the mobile data center.

Embodiments of the invention may include an oil-filled pad mount transformer. A transformer transfers electrical energy from one circuit to another, or to multiple circuit. They may be used to change voltage levels from high-voltage electrical grid distribution to localized commercial and residential voltages. Oil-filled transformers use oil to insulate the transformer and keep it at operating temperature. Pad mounted transformers are located on the ground, such as on a concrete pad, allowing easy access to the components therein.

Accordingly, the invention provides numerous advantages over existing technologies. For example, the invention has significant advantages over a vertical setup within the shipping container. By laying the immersion tanks and the rigs below the flooring surface of the container, the design of the invention can accommodate more rigs, and to cool them more efficiently compared to a vertical design that is much less efficient. For example, in one embodiment, each immersion tank accommodates 96 rigs, and each shipping container, once converted, can contains 4 immersion tanks, such that a converted shipping container can accommodate up to 384 rigs. By saving space and adding more rigs, the invention presents a significant capacity and efficiency upgrade compared to other liquid cooled designs. Even when overclocking the rigs by up to 41%, this space-saving and highly efficient liquid cooled design was able to maintain the chips at functional temperatures comparable to, or even less than, at baseline. Total efficiencies built into the invention increase potential earnings of a cryptocurrency mining use of the invention by 49%. The overall cost of the system of the invention can be recovered in just 440 days of use, as compared to 518 days of a comparable air-cooled system.

The invention is also advantageous because of the space that is saved above the flooring. This allows for more working area and easy access to each rig and its control unit. The modular design facilitates easy maintenance and allows individual sections to be removed and serviced while keeping the rest of the container operational. The electrical system and fluid paths can be isolated by section if needed. The invention meets National Electrical Code (NEC) standards and is compliant with Occupational Safety and Health Administration (OSHA) standards. Also, by using a standard size shipping container, the mobility of the unit is improved, and allows for efficient delivery of the systems as well as convenience for the customer should the unit need to be moved.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

INCORPORATION BY REFERENCE

References and citations to other documents, such as patents, patent applications, patent publications, journals, books, papers, web contents, have been made throughout this disclosure. All such documents are hereby incorporated herein by reference in their entirety for all purposes.

EQUIVALENTS

Various modifications of the invention and many further embodiments thereof, in addition to those shown and described herein, will become apparent to those skilled in the art from the full contents of this document, including references to the scientific and patent literature cited herein. The subject matter herein contains important information, exemplification and guidance that can be adapted to the practice of this invention in its various embodiments and equivalents thereof.

The invention claimed is:

1. A mobile data center for housing and managing a plurality of computing devices, the mobile data center comprising:
    a housing structure having a base, a top, two long walls and two short walls extending between the base and the top to cooperatively define a substantially rectangular shape;
    an immersion cooling assembly provided on the base of the housing structure, the immersion cooling assembly comprising a plurality of modular tanks positioned in a horizontal orientation relative to the base of the housing structure, each of the plurality of modular tanks is configured to contain a non-conductive fluid to immerse a plurality of computing devices within and cool the plurality of computing devices during operation thereof, wherein the plurality of modular tanks are positioned under a flooring of the housing structure, the flooring extending entirely along a length of the housing structure from one of the two short walls of the housing structure to another one of the two short walls of the of the housing structure, and the plurality of modular tanks are positioned in a serial fashion under the flooring; and
    an electrical distribution system including a busway system and power distribution units (PDUs) for providing electrical power to the plurality of computing devices, the PDUs being operably associated with the plurality of computing devices, wherein the busway system and the PDUs are disposed above the flooring of the housing structure, and the busway system in combination with the PDUs allows for removal and maintenance of at least one of the computing devices at a time,
    wherein the flooring is configured to allow a user to:
    gain access underneath the flooring to the one or more modular tanks and the plurality of computing devices therein through removable portions of the flooring, and access the PDUs disposed above the flooring through remaining portions of the flooring to connect/disconnect the computing devices from the electrical distribution system.

2. The mobile data center of claim 1, wherein the housing structure is comprised of a shipping container.

3. The mobile data center of claim 1, further comprising the plurality of computing devices provided within the one or more modular tanks.

4. The mobile data center of claim 3, wherein each of the plurality of computing devices is configured to provide energy-intensive computing tasks during operation thereof.

5. The mobile data center of claim 4, wherein one or more of the plurality of computing devices is configured to perform blockchain computing tasks.

6. The mobile data center of claim 5, wherein one or more of the plurality of computing devices is configured to perform cryptocurrency mining.

7. The mobile data center of claim 1, wherein the removable portions of the flooring comprises removable tiles.

8. The mobile data center of claim 1, further comprising an oil-filled pad mount transformer.

9. The mobile data center of claim 1, wherein one or more of the plurality of modular tanks is configured to be accessed and serviced while at least another one of the plurality of modular tanks within the mobile data center are operating and/or functioning as intended.

10. The mobile data center of claim 1, wherein at least one of the plurality of modular tanks is configured to house at least 96 of the computing devices within.

11. The mobile data center of claim 10, wherein the plurality of modular tanks comprises at least four modular tanks arranged horizontally within the mobile data center, each of said at least four modular tanks being configured to house 96 of the computing devices within such that the mobile data center is configured to house and manage cooling of at least 384 of the computing devices.

12. The mobile data center of claim 1, further comprising the non-conductive fluid provided within the plurality of modular tanks, the non-conductive fluid comprising a fluorochemical or a hydrocarbon base oil.

13. The mobile data center of claim 1, wherein the mobile data center is configured to maintain operation of the plurality of computing devices at ambient temperatures up to 110° F.

14. The mobile data center of claim 1, wherein the mobile data center is configured to maintain operation of the plurality of computing devices for a longer uptime than a comparable air-cooled system or assembly.

15. The mobile data center of claim 1, wherein the mobile data center provides transactional capacity at least 20% greater than that of an air-cooled system or assembly.

16. The mobile data center of claim 1, wherein the mobile data center allows for overclocking of the plurality of computing devices by up to 40% while maintaining processors of said plurality of computing devices at functional temperatures.

* * * * *